United States Patent
Takesawa

(10) Patent No.: US 10,236,269 B2
(45) Date of Patent: Mar. 19, 2019

(54) SEMICONDUCTOR DEVICE HAVING SEMICONDUCTOR CHIP WITH LARGE AND SMALL IRREGULARITIES ON UPPER AND LOWER SIDE SURFACE PORTIONS THEREOF

(71) Applicant: SII Semiconductor Corporation, Chiba-shi, Chiba (JP)

(72) Inventor: Makoto Takesawa, Chiba (JP)

(73) Assignee: ABLIC INC. (JP)

( * ) Notice: Subject to any disclaimer, the term of this patent is extended or adjusted under 35 U.S.C. 154(b) by 0 days.

(21) Appl. No.: 15/885,457

(22) Filed: Jan. 31, 2018

(65) Prior Publication Data

US 2018/0158792 A1    Jun. 7, 2018

Related U.S. Application Data

(63) Continuation of application No. 14/617,530, filed on Feb. 9, 2015, now Pat. No. 9,887,171.

(30) Foreign Application Priority Data

Feb. 13, 2014    (JP) ................................ 2014-025799

(51) Int. Cl.
*H01L 23/48*    (2006.01)
*H01L 23/544*   (2006.01)
(Continued)

(52) U.S. Cl.
CPC .............. *H01L 24/27* (2013.01); *B23K 26/53* (2015.10); *H01L 23/3142* (2013.01);
(Continued)

(58) Field of Classification Search
CPC ... H01L 23/4334; H01L 33/22; H01L 21/428; H01L 23/3142; H01L 24/03; H01L 24/08;
(Continued)

(56) References Cited

U.S. PATENT DOCUMENTS 5,429,954 A      7/1995  Gerner ............................ 257/13
6,140,248 A *   10/2000  Fischer ............... H01L 29/0657
                                                          134/1.3

(Continued)

FOREIGN PATENT DOCUMENTS

| TW | 2010041185 | 11/2010 |
|----|------------|---------|
| TW | 2011006504 | 2/2011  |
| TW | 2013027655 | 7/2013  |

OTHER PUBLICATIONS

Abstract, Publication No. JP 2001-223304, Publication Date Aug. 17, 2001.

(Continued)

*Primary Examiner* — Kimberly N Rizkallah
*Assistant Examiner* — Dilinh P Nguyen
(74) *Attorney, Agent, or Firm* — Adams & Wilks

(57) ABSTRACT

A semiconductor device has a semiconductor chip adhesively bonded to a die pad. An area having large irregularities is formed on an upper side surface of the semiconductor chip to be covered by an encapsulating resin, and an area having small irregularities is formed on a lower side surface of the semiconductor chip, thereby improving adhesive strength between the semiconductor chip and the encapsulating resin and preventing penetration of moisture from outside.

3 Claims, 5 Drawing Sheets

(51) Int. Cl.
  *H01L 21/44* (2006.01)
  *H01L 21/48* (2006.01)
  *H01L 23/00* (2006.01)
  *H01L 23/31* (2006.01)
  *B23K 26/53* (2014.01)
  *B23K 103/00* (2006.01)

(52) U.S. Cl.
  CPC .............. *H01L 24/03* (2013.01); *H01L 24/08* (2013.01); *B23K 2103/50* (2018.08); *B23K 2103/56* (2018.08); *H01L 23/3107* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 2224/0801* (2013.01); *H01L 2224/29339* (2013.01); *H01L 2224/32013* (2013.01); *H01L 2224/32145* (2013.01); *H01L 2224/32245* (2013.01); *H01L 2224/45144* (2013.01); *H01L 2224/45147* (2013.01); *H01L 2224/48247* (2013.01); *H01L 2224/4912* (2013.01); *H01L 2224/49175* (2013.01); *H01L 2224/73265* (2013.01); *H01L 2224/92247* (2013.01); *H01L 2924/10156* (2013.01); *H01L 2924/12042* (2013.01); *H01L 2924/181* (2013.01); *H01L 2924/18301* (2013.01)

(58) Field of Classification Search
  CPC ........... H01L 24/27; H01L 2924/12042; H01L 23/3107; H01L 2224/29339; H01L 2924/10156; H01L 24/73; H01L 24/45; H01L 2224/32013; H01L 2224/92247; H01L 2224/49175; H01L 2924/18301; H01L 2224/48247; H01L 24/29; H01L 2224/32245; H01L 2224/73265; H01L 2924/181; H01L 2224/45144; H01L 2224/45147; H01L 24/32; H01L 2224/32145; H01L 2224/0801; H01L 2224/4912; H01L 24/49; H01L 25/04; H01L 21/78; H01L 33/0095; H01L 41/338
  USPC ........ 257/693, 675, 783, 787, 620; 438/110, 438/113
  See application file for complete search history.

(56) References Cited

U.S. PATENT DOCUMENTS

| | | | |
|---|---|---|---|
| 7,015,516 B2 | 3/2006 | Eliashevich | 257/103 |
| 9,887,171 B2* | 2/2018 | Takesawa | H01L 24/03 |
| 2008/0315232 A1 | 12/2008 | Matsuo | 257/98 |
| 2011/0127658 A1 | 6/2011 | Tzu | 257/675 |
| 2011/0291143 A1 | 12/2011 | Kim et al. | 257/98 |

OTHER PUBLICATIONS

Abstract, Publication No. JP 2005-223305, Publication Date Aug. 18, 2005.

* cited by examiner

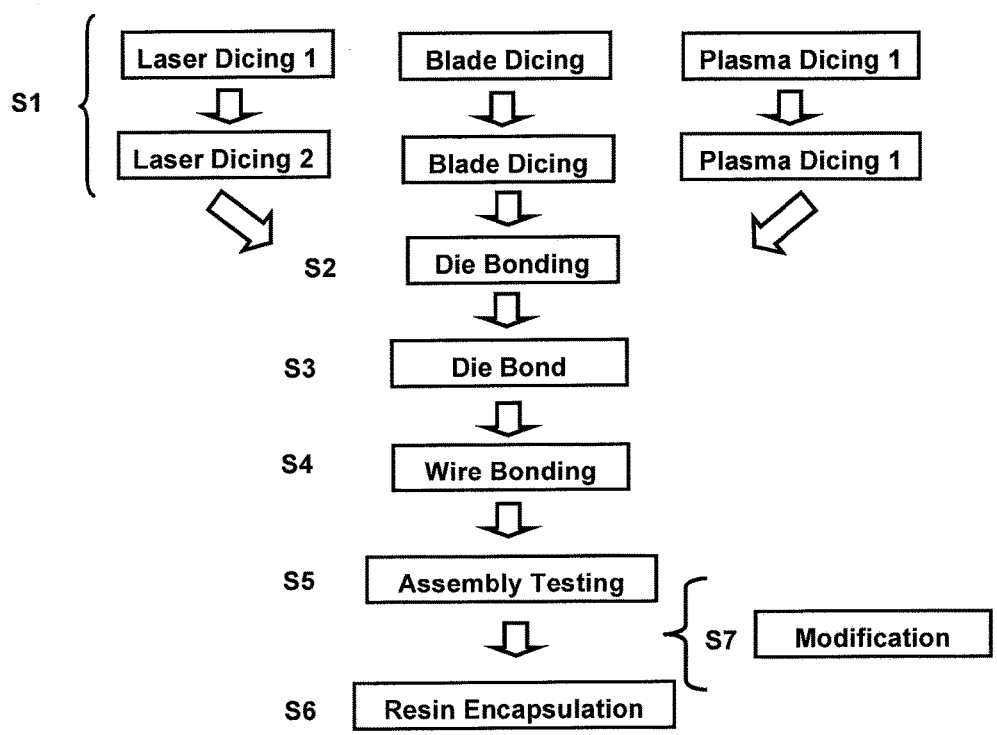

SEMICONDUCTOR DEVICE HAVING SEMICONDUCTOR CHIP WITH LARGE AND SMALL IRREGULARITIES ON UPPER AND LOWER SIDE SURFACE PORTIONS THEREOF

RELATED APPLICATION

This application is a continuation of application Ser. No. 14/617,530 filed Feb. 9, 2015 claiming priority of Japanese Application No. 2014-025799 filed Feb. 13, 2014, the entire contents of which are incorporated herein by reference.

BACKGROUND OF THE INVENTION

1. Field of the Invention

The present invention relates to a method of manufacturing a semiconductor device, and more particularly, to a method of manufacturing a semiconductor package capable of suppressing the occurrence of delamination between a semiconductor chip and a mold resin.

2. Description of the Related Art

In recent years, the environment relating to semiconductor devices has been advanced particularly in the field of automotive on-board electronics. The number of electronic parts to be mounted in the engine compartment has been increasing, which has led to demands from the market for guaranteed operation under a high-temperature and high-humidity environment. The methods of testing guaranteed operation are specifically stipulated by public bodies. For example, the moisture sensitivity level (hereinafter referred to as MSL) in J-STD-020D "Moisture/Reflow Sensitivity Classification for Non-hermetic Solid State Surface Mount Devices", which is a typical standard by IPC/JEDEC, stipulates the storage temperature and humidity conditions, the processing time after opening, and the conditions for the reliability test.

In order to handle such a test, it is necessary to suppress delamination at each adhesion boundary particularly in the semiconductor package. In view of this, various structures and manufacturing methods have hitherto been disclosed.

For example, in Japanese Patent Application Laid-open No. 2005-223305, there is disclosed a resin-encapsulated semiconductor device having improved adhesive properties with a mold resin and a high degree of reliability in which the surface of a lead frame is plated and irregularities are formed on the plated surface formed of Pd/Ni/Au and the like, which is called a PPF (pre-plated frame).

Further, thermal stress produced by differences in the thermal expansion coefficients of the various constituent materials is also a cause of delamination. To suppress this, in Japanese Patent Application Laid-open No. 2001-223304, there is disclosed a resin-encapsulated semiconductor device having a small level of thermal stress in the semiconductor package and a high degree of reliability of the package by adjusting the thermal expansion coefficient and the bending elasticity of the mold resin.

However, semiconductor package delamination cannot be completely suppressed even if those technologies are used. The reason for this is due to differences in the thermal expansion coefficients of the different materials that are used for the lead frame, the mold resin, and the semiconductor chip, respectively, which are the main constituent materials of the semiconductor package. Further, because the surface states are also different due to differences in the processing methods of each material, the internal adhesive strength and stress are in an uneven state. Therefore, even if the adhesive properties of a specific part are improved and the stress of the mold resin is reduced, unless the internal adhesive strength is made relatively more uniform, stress inevitably concentrates at a portion having a weak adhesive strength to induce delamination from that part. Although the adhesive properties between the protective film surface and the encapsulating resin of the semiconductor chip, and the adhesive properties between the lead frame and the encapsulating resin have been improved, there are portions having weak adhesive properties in some places.

FIGS. 4A and 4B illustrate delamination on a side surface of a semiconductor chip. As illustrated in FIG. 4A, a semiconductor chip 2 is mounted on a die pad 3 having a roughened surface 15 on a surface thereof via an adhesive 18 such as a silver paste. A top surface of the semiconductor chip 2 is covered by a protective film 17, which is formed of a polyimide film and the like. The die pad 3 and the semiconductor chip 2 are encapsulated by an encapsulating resin 8. FIG. 4B illustrates an enlarged view of a side surface of the semiconductor chip 2. A peeling portion 19, called the delamination, is present on the side surface of the semiconductor chip 2. The encapsulating resin 8 and the semiconductor chip 2 are not closely adhered, and there is a problem in that humidity resistance is low.

SUMMARY OF THE INVENTION

The present invention provides a semiconductor device and a method of manufacturing the same that solve the above-mentioned problem.

In order to solve the problem described above, the following measures are taken.

First, according to one embodiment of the present invention, there is provided a semiconductor device, including: a semiconductor chip; a die pad for supporting the semiconductor chip; an adhesive for adhering the semiconductor chip and the die pad; a plurality of signal leads extending toward a side of the die pad; bonding wires for connecting the semiconductor chip and the plurality of signal leads; and an encapsulating body for encapsulating with a mold resin, in which a side surface of the semiconductor chip includes a first irregular side surface and a second irregular side surface formed above the first irregular side surface, and the second irregular side surface includes second irregularities that are larger than first irregularities formed on the first irregular side surface.

Further, in the semiconductor device, the second irregular side surface corresponds to ⅔ or more of a thickness of the semiconductor chip.

Further, according to one embodiment of the present invention, there is employed a method of manufacturing a semiconductor device including: a semiconductor chip; a die pad for supporting the semiconductor chip; an adhesive for adhering the semiconductor chip and the die pad; a plurality of signal leads extending toward a side of the die pad; bonding wires for connecting the semiconductor chip and the plurality of signal leads; and an encapsulating body for encapsulating with a mold resin, the method including: forming a first irregular side surface on a side surface of the semiconductor chip; and forming a second irregular side surface on the side surface of the semiconductor chip.

Further, in the method of manufacturing a semiconductor device, the forming a second irregular side surface includes forming a continuous modified layer in the semiconductor chip with a pulsed laser.

Further, in the method of manufacturing a semiconductor device, the forming a second irregular side surface includes using an ablation laser.

Further, in the method of manufacturing a semiconductor device, the forming a first irregular side surface includes forming modified layers separated from each other in the semiconductor chip with a pulsed laser.

Further, in the method of manufacturing a semiconductor device, the forming a second irregular side surface includes blade dicing, the blade dicing using a dicing blade having a #1000 mesh size or less.

Further, the method of manufacturing a semiconductor device further includes isotropic plasma silicon etching after the blade dicing.

Further, in the method of manufacturing a semiconductor device, the forming a second irregular side surface includes plasma dicing, the plasma dicing including silicon etching of Bosch process.

By taking the above-mentioned measures, the semiconductor device can be obtained having improved adhesion between the semiconductor chip and the encapsulating resin, and satisfactory humidity resistance.

BRIEF DESCRIPTION OF THE DRAWINGS

FIGS. 3A to 3C are step flow diagrams illustrating a method of manufacturing the semiconductor device according to the present invention.

DETAILED DESCRIPTION OF THE INVENTION

A semiconductor device and a method of manufacturing the same of the present invention are described with reference to the drawings.

Figure 1A:
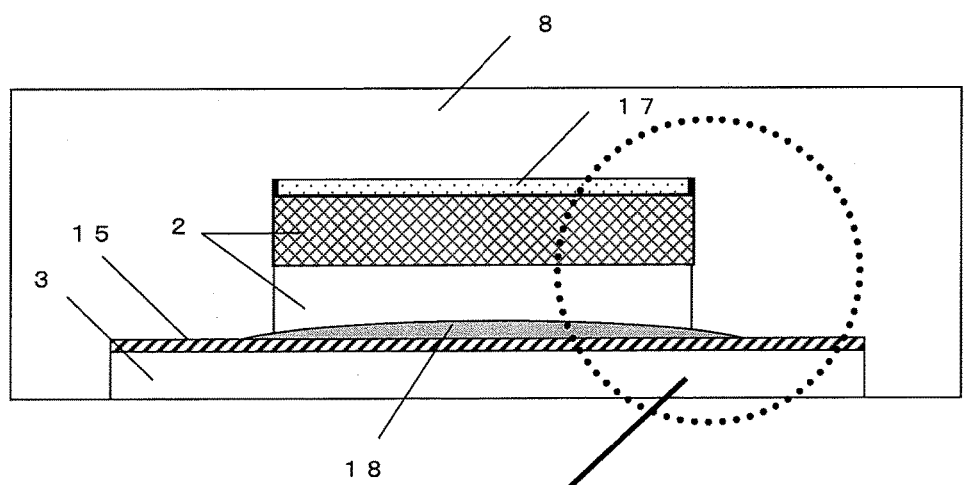
FIGS. 1A and 1B are cross-sectional views illustrating a semiconductor device according to a first embodiment of the present invention.
Figure 1B:
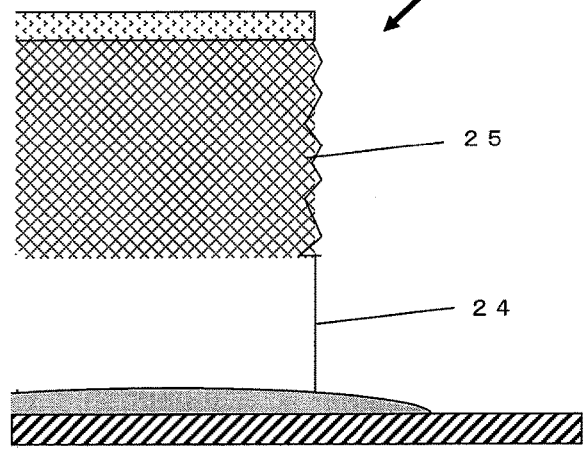

FIGS. 1A and 1B are partial cross-sectional views of the semiconductor device according to the present invention. As illustrated in FIG. 1A, a semiconductor chip 2 having top and bottom surfaces bounded by a side surface is mounted on a die pad 3 having a roughened surface 15 on a top surface thereof via an adhesive 18 such as a silver paste. The top surface of the semiconductor chip 2 is covered by a protective film 17, which is formed of a polyimide film and the like. The die pad 3 and the semiconductor chip 2 are encapsulated by an encapsulating resin 8. FIG. 1B illustrates an enlarged view of the side surface of the semiconductor chip 2. A first irregular side surface 24 formed of small irregularities is formed on a side surface lower portion of the semiconductor chip 2 (the first irregularities are not shown). A second irregular side surface 25 on which irregularities, which are larger than the irregularities on the side surface lower portion, is formed on a side surface upper portion of the semiconductor chip 2. As illustrated in FIGS. 1A and 1B, the side surface lower and upper portions are generally perpendicular to the bottom surface of the semiconductor chip 2. With this configuration, the adhesive strength between the side surface upper portion of the semiconductor chip in which semiconductor elements are formed and the encapsulating resin 8 is improved, and hence the penetration of moisture is suppressed, and a semiconductor device having good moisture resistance can be obtained. It is noted that, the terms large and small used herein regarding the irregularities refer to the length from the bottom of the depressed portion to the top of the projecting portion of the formed irregularities being large or small.

Further, by providing the first irregular side surface 24 at the side surface lower portion of the semiconductor chip 2, the adhesive 18 creeps up more satisfactorily during die bonding, so that the adhesive properties with the die pad 3 are improved even for a small semiconductor chip.

Figure 2:
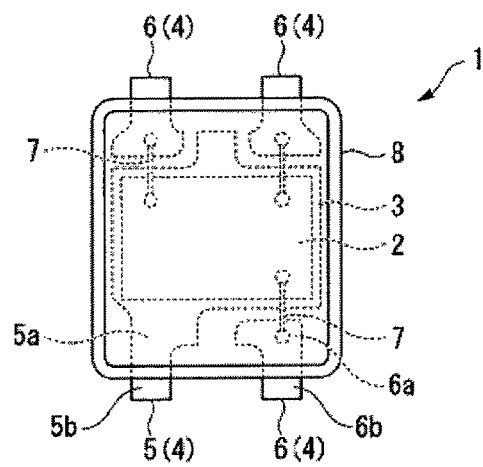
FIG. 2 is a plan view of the semiconductor device according to the present invention.
Figure 4A:
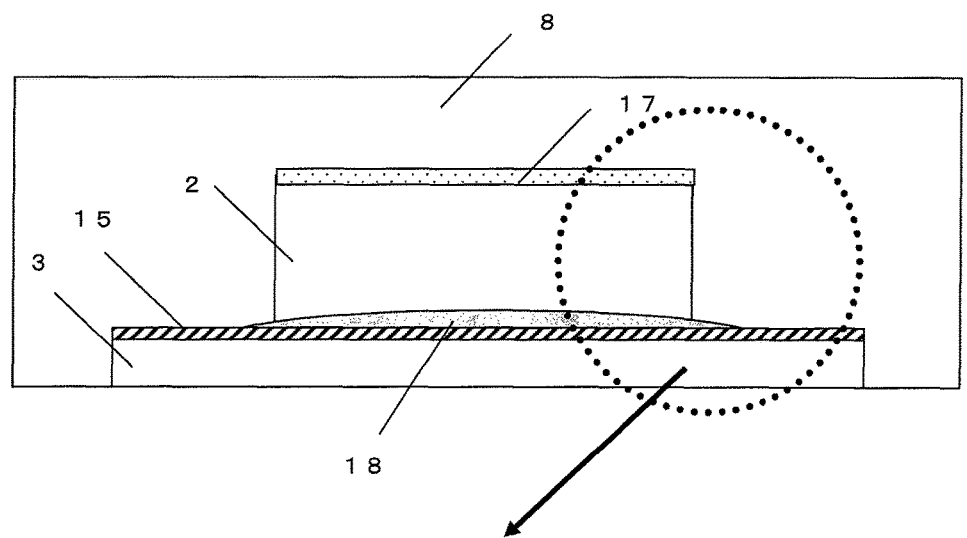
FIGS. 4A and 4B are cross-sectional views of a related-art semiconductor device.
Figure 4B:
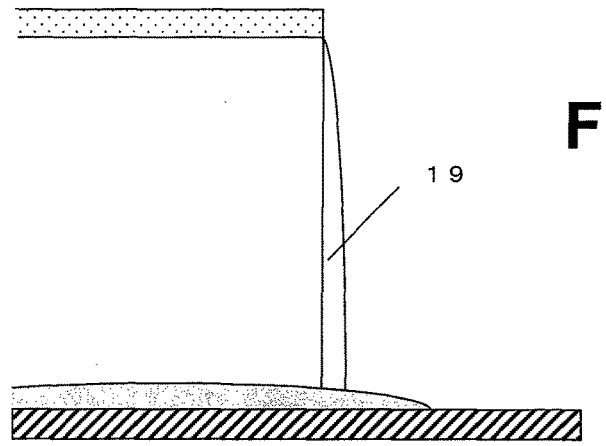

FIG. 2 is a plan view illustrating a configuration of the semiconductor device according to the present invention. A resin-encapsulated semiconductor device 1 includes the semiconductor chip 2, the die pad 3 for fixing the semiconductor chip 2, and leads 4 extending on both sides of the die pad 3. The semiconductor chip 2 is constructed by, for example, a semiconductor substrate, a wiring layer provided on the semiconductor substrate, and the like. The semiconductor chip 2 is adhesively fixed to the die pad 3. The die pad 3 and the leads 4, which are conductive, are formed of, for example, a metal such as a Fe—Ni alloy or a Cu alloy. A plurality of leads 4 are arranged around the die pad 3. A total of four leads 4 are arranged, i.e., two on one side of the die pad 3, and two on another side opposite thereto. One of the leads 4 is a suspension lead 5. A base portion 5a of the suspension lead 5 is fixed to the die pad 3. The other three leads 4 are leads 6 separated from the die pad 3. An inner portion 6a of the leads 6 is electrically connected to the semiconductor chip 2 via conductive bonding wires 7. A gold wire or a copper wire is used for the bonding wires 7. The thus configured semiconductor chip 2, die pad 3, and inner portion 6a of the leads 6 are encapsulated by the encapsulating resin 8 formed of a resin, thereby protecting the semiconductor chip 2 from external shocks and the like, electrically insulating the semiconductor chip 2, and enabling the semiconductor chip 2 to be electrically connected to the outside via the plurality of leads 4. As the encapsulating resin 8, for example, a biphenyl-based insulating resin having added therein a phenolic curing agent, silicon rubber, filler, and the like may be used.

Next, a method of manufacturing the semiconductor device of the present invention is described with reference to FIGS. 3A to 3C.

First, steps S1 to S6 illustrated in FIGS. 3A to 3C are described. A dicing step S1 is a step of dividing a semiconductor wafer into semiconductor chips. A die bonding step S2 is a step of adhering a semiconductor chip to a die pad area of a lead frame using a silver paste and the like. Next, a die bonding curing step S3 is a step of curing a bonding portion by heating the adhered die pad and semiconductor chip. Next, a wire bonding step S4 is a step of connecting a bonding wire to an electrode portion of the semiconductor surface and a lead inner portion based on a bonding method that combines ultrasonic oscillation with thermocompression bonding. Further, in an assembly and testing step S5, testing is carried out on the bonding state of the semiconductor chip to the die pad and the bonding state of the bonding wire to the semiconductor chip. Then, the processing proceeds to a resin encapsulating step S6.

In the resin encapsulating step S6, first, a mold including cavities, which are spaces surrounding the die pad and the semiconductor chip, a runner for causing the encapsulating resin to be injected to flow to the vicinity of each cavity, and a gate for connecting the runner and the cavities, is prepared correspondingly to each die pad. After the lead frame is sandwiched by the mold, and the encapsulating resin is injected and filled into each mold, the encapsulated lead frame is removed from the mold. At this point, thin resin burrs are formed between the leads and the like. Those burrs are formed by resin that has leaked out from slight gaps during the filling of the resin into the cavities of the mold. Depending on the mold, the resin burrs are formed at different positions and in different shapes for each mold.

The dicing step S1 is now described in more detail using three methods as examples.

Figure 5A:
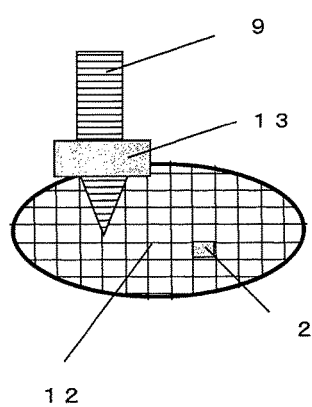
FIGS. 5A and 5B illustrate a method of manufacturing the semiconductor device according to the present invention.
Figure 5B:
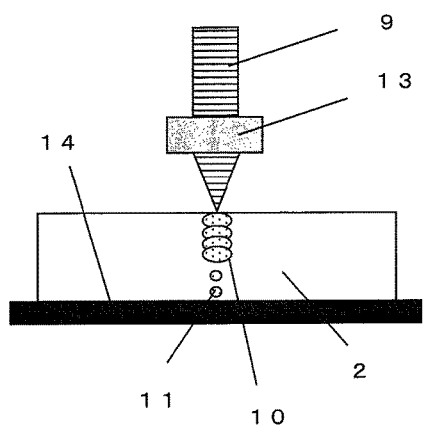

First, FIG. 3A illustrates a manufacturing method that uses a laser dicing step. As illustrated in FIGS. 5A and 5B, a pulsed laser 9 is irradiated via a condensing lens 13 onto a scribe line 12 provided between a semiconductor chip 2 formed on a semiconductor substrate on which a dicing tape 14 has been attached and an adjacent semiconductor chip 2. The pulsed laser 9 is irradiated in multiple steps in a depth direction to form a modified layer 10 on the laser-irradiated area. The pulsed laser is irradiated in a concentrated manner at a high power on the upper ⅔ of the thickness direction of the semiconductor chip 2 so that the modified layer 10 to be formed in the depth direction is continuously formed in a plane. This operation, which corresponds to the laser dicing step 1 of FIG. 3A, is a step of forming the roughened second irregular side surface 25 of FIG. 1B. The laser dicing step 2 is a step of forming the roughened first irregular side surface 24 in the lower ⅓ of the thickness direction of the semiconductor chip. In this step, modified layers 11 to be formed in the depth direction by a low power laser are separately formed from each other and as illustrated in FIG. 5B, are separated from one another by regions between the modified layers 11 that do not form the first irregularities when the semiconductor wafer is cleaved along the scribe lines 12. The size of the individual modified layers 11 is smaller than the size of the modified layer 10 formed in the laser dicing step 1. After carrying out the laser dicing steps 1 and 2, cleaving is carried out to obtain the semiconductor chip 2 having the roughened first irregular side surface 24 and the roughened second irregular side surface 25.

If the thickness of the second irregular side surface 25 is sufficiently thick with respect to the thickness of the semiconductor chip 2, there is no need to carry out the laser dicing step 2, and hence the cleaving can be carried out after the laser dicing step 1. In this manufacturing method, irregularities having the same size as the above-mentioned example are formed on the second irregular side surface 25. However, the first irregular side surface 24 has very small irregularities because the first irregular side surface 24 is a cleaved surface.

An example has been described above in which the pulsed laser is irradiated from the top surface, which is a surface on which the elements of the semiconductor chip are formed. However, the pulsed laser may be irradiated from a back surface of the semiconductor chip so as to avoid a TEG formed on the scribe line.

The second irregular side surface 25 may also be realized using an ablation laser method instead of a pulsed laser method. In this case, an ablation laser is used in the laser dicing step 1, which enables larger irregularities to be formed than in the pulsed laser method. In the laser dicing step 2, a low power pulsed laser is used, and then cleaving is carried out to obtain the semiconductor chip.

Figure 6A:
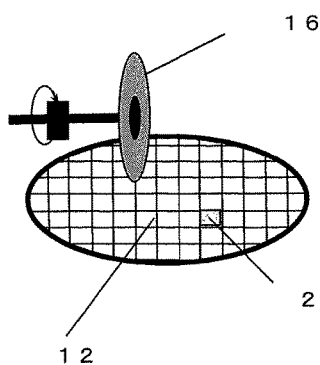
FIGS. 6A and 6B illustrate a method of manufacturing the semiconductor device according to the present invention.
Figure 6B:
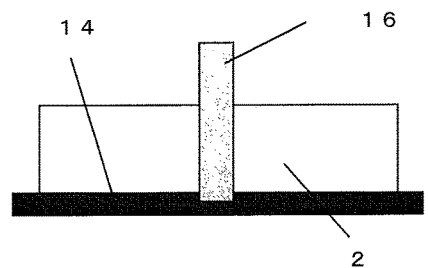

Next, FIG. 3B illustrates a manufacturing method using a blade dicing step. As illustrated in FIGS. 6A and 6B, in this manufacturing method, a dicing blade 16 is applied along scribe lines 12 provided between the semiconductor chip 2 formed on a semiconductor substrate on which the dicing tape 14 has been attached and an adjacent semiconductor chip 2 to cleave the semiconductor wafer into individual semiconductor chips. Here, using two types of dicing blade having different grain sizes, in a blade dicing step 1, the roughened second irregular side surface 25 is formed by half-dicing from the semiconductor chip surface with a blade having a roughness of #1000 mesh or less. Next, in a blade dicing step 2, the roughened first irregular side surface 24 is formed by cleaving using a blade having a #2000 mesh or more to obtain the semiconductor chip 2 having the first irregular side surface 24 and the second irregular side surface 25. In this manufacturing method, a semiconductor device having higher moisture resistance can be obtained by adding a modifying step S7 such as isotropic plasma silicon etching to remove a damaged layer on the cleaved surface.

FIG. 3C illustrates a manufacturing method using a plasma dicing step. In a plasma dicing step 1, the roughened second irregular side surface 25 is formed by silicon etching based on the Bosch process, in which isotropic etching and deposition of a protective film are repeated. In the Bosch process, continuous irregularities called scallops are formed on the semiconductor chip side surface. Then, the remaining silicon etching is carried out in a plasma dicing step 2 to cut the semiconductor wafer into individual semiconductor chips. Here, instead of the Bosch process, a method in which deep drilling is carried out by anisotropic etching is used. By carrying out such plasma dicing steps 1 and 2, the semiconductor chip 2 having the roughened first irregular side surface 24 and the roughened second irregular side surface 25 is obtained.

What is claimed is:

1. A semiconductor device, comprising:
  a semiconductor chip having a bottom surface;
  a die pad supporting the semiconductor chip;
  an adhesive adhering the semiconductor chip and the die pad;
  a plurality of signal leads extending toward a side of the die pad; and
  an encapsulating resin encapsulating the semiconductor chip and a part of each signal lead,
  wherein a side surface of the semiconductor chip comprises a first irregular side surface and a second irregular side surface located above the first irregular side surface,
  wherein the first irregular side surface and the second irregular side surface are both generally perpendicular to the bottom surface of the semiconductor chip and lie generally in the same plane,
  wherein the second irregular side surface comprises second irregularities that are larger than first irregularities on the first irregular side surface,
  wherein the first irregular side surface has regions, separated from one another in a depth direction of the semiconductor chip, that do not have the first irregularities, and
  wherein the encapsulating resin is in direct contact with the semiconductor chip and directly contacts the first irregular side surface and the second irregular side surface.

2. A semiconductor device according to claim 1, wherein the second irregular side surface corresponds to two thirds or more of a thickness of the semiconductor chip.

3. A semiconductor device, comprising:
- a semiconductor chip having top and bottom surfaces bounded by a side surface;
- a die pad on which the bottom surface of the semiconductor chip is disposed;
- an adhesive interposed between the bottom surface of the semiconductor chip and the die pad;
- signal leads extending toward the die pad; and
- an encapsulating resin encapsulating the semiconductor chip and a part of each signal lead;
- wherein the side surface of the semiconductor chip comprises a roughened lower surface portion extending from the bottom surface toward the top surface of the semiconductor chip and on which first roughened surface irregularities are formed, and a roughened upper surface portion extending from the roughened lower surface portion to the top surface of the semiconductor chip and on which second roughened surface irregularities are formed,
- wherein the roughened lower surface portion has regions, separated from one another, on which the first roughened surface irregularities are not formed,
- wherein the roughened lower and roughened upper surface portions of the side surface lie generally in the same plane,
- wherein the second roughened surface irregularities are larger than the first roughened surface irregularities, and
- wherein the encapsulating resin is in direct contact with the semiconductor chip and directly contacts the first and second roughened surface irregularities.

* * * * *